(12) United States Patent
Chih et al.

(10) Patent No.: US 9,997,244 B1
(45) Date of Patent: Jun. 12, 2018

(54) RRAM-BASED AUTHENTICATION CIRCUIT

(71) Applicant: Taiwan Semiconductor Manufacturing Co., Ltd., Hsin-Chu (TW)

(72) Inventors: Yu-Der Chih, Hsin-Chu (TW); Shih-Lien Linus Lu, Hsinchu (TW); Yu-Der Chih, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/435,082

(22) Filed: Feb. 16, 2017

Related U.S. Application Data (60) Provisional application No. 62/427,550, filed on Nov. 29, 2016.

(51) Int. Cl.
  *G11C 13/00* (2006.01)
(52) U.S. Cl.
  CPC ........ *G11C 13/0059* (2013.01); *G11C 13/004* (2013.01); *G11C 13/0069* (2013.01)
(58) Field of Classification Search
  CPC ..................... G11C 13/0059; G11C 13/004
  USPC ...................................................... 365/148
  See application file for complete search history.

(56) References Cited

U.S. PATENT DOCUMENTS

| 8,593,854 | B1 | 11/2013 | Chih et al. |
| 8,869,436 | B2 | 10/2014 | Tsai et al. |
| 9,019,743 | B2 | 4/2015 | Tsai et al. |
| 9,023,699 | B2 | 5/2015 | Chang et al. |
| 9,053,781 | B2 | 6/2015 | Tsai et al. |
| 9,076,522 | B2 | 7/2015 | You et al. |
| 9,153,343 | B2 | 10/2015 | Chu et al. |
| 9,196,360 | B2 | 11/2015 | Chou et al. |
| 9,224,470 | B1 | 12/2015 | Chiu et al. |
| 2012/0140545 | A1* | 6/2012 | Kim .................... G11C 7/04 365/148 |
| 2012/0182786 | A1* | 7/2012 | Baek .................. G11C 8/10 365/148 |
| 2013/0234094 | A1 | 9/2013 | Chang et al. |
| 2014/0166961 | A1 | 6/2014 | Liao et al. |
| 2014/0203236 | A1 | 7/2014 | Chen et al. |
| 2014/0264222 | A1 | 9/2014 | Yang et al. |
| 2014/0264233 | A1 | 9/2014 | Tu et al. |
| 2014/0268994 | A1* | 9/2014 | Rose ................ G11C 13/0059 365/148 |
| 2014/0293674 | A1* | 10/2014 | Johnson ............ G11C 13/0069 365/148 |
| 2015/0048297 | A1 | 2/2015 | Hsieh et al. |
| 2015/0085558 | A1 | 3/2015 | Chang et al. |
| 2015/0109849 | A1* | 4/2015 | Tsai .................. G11C 13/0069 365/148 |

(Continued)

*Primary Examiner* — Hoai V Ho
*Assistant Examiner* — Muna A Techane
(74) *Attorney, Agent, or Firm* — Duane Morris LLP (57) ABSTRACT

A memory device includes a memory array comprising a plurality of bits, wherein each bit comprises two memory cells each having a variable resistance; a formation circuit, coupled to the plurality of bits, and configured to cause a first memory cell of a first bit to be at a low resistance state; and an authentication circuit, coupled to the plurality of bits, configured to designate a logical state to the first memory cell of the first bit and use the logical state of the first memory cell of the first bit to generate a physically unclonable function (PUF) signature.

20 Claims, 10 Drawing Sheets

(56) References Cited

U.S. PATENT DOCUMENTS

| | | |
|---|---|---|
| 2015/0109850 A1 | 4/2015 | Chang et al. |
| 2015/0170741 A1 | 6/2015 | Chih et al. |
| 2015/0269997 A1 | 9/2015 | Lin et al. |
| 2015/0364187 A1* | 12/2015 | Kim .................... G11C 13/004 365/148 |
| 2015/0380063 A1 | 12/2015 | Chang et al. |
| 2016/0276027 A1* | 9/2016 | Lin .................... G11C 13/0069 |

* cited by examiner

RRAM-BASED AUTHENTICATION CIRCUIT

CROSS-REFERENCE TO RELATED APPLICATION

The present application claims priority to U.S. Provisional Patent Application No. 62/427,550, filed on Nov. 29, 2016, which is incorporated by reference herein in its entirety.

BACKGROUND

With the increasing use of integrated circuits in electronic devices that provide different types of information for a variety of different applications, there has been an increasing need to adequately protect sensitive and/or critical information that may be stored within an electronic device to limit access to such information to only other devices that have permission to access the information. Some examples of applications include the authentication of devices, protection of confidential information within a device, and securing a communication between two or more devices.

A physically unclonable function (PUF) is a physical structure generally within an integrated circuit that provides a number of corresponding outputs (e.g., responses) in response to inputs (e.g., challenges/requests) to the PUF. Each PUF provides one or more sets of request-response pairs. An identity of the integrated circuit may be established by such request-response pairs provided by the PUF. With the establishment of the identity, secure communication can be provided between devices. The PUF can also be used for existing authentication purposes to replace the current method of assigning an identity to an electronic device. Since the PUF is based on intrinsic properties of a manufacturing process, the PUF has various advantages over conventional authentication approaches that inscribe an identity on a device that may be mimicked and/or reverse engineered more easily.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

A physical unclonable function (PUF) is generally used for authentication and secret key storage without requiring secure electrically erasable programmable read-only memory (EEPROMs) (or any of other non-volatile memory) and/or other expensive hardware (e.g., battery-backed static random-access memory). Instead of storing secrets in a digital memory, the PUF derives a secret from physical characteristics of an integrated circuit (IC). The PUF is based on an idea that even though an identical manufacturing process is used to fabricate a plurality of ICs, each IC may be slightly different due to manufacturing variability. PUFs leverage this variability to derive "secret" information that is unique to each of the ICs (e.g., a silicon "biometric"). Generally, such secret information is referred to as a "signature" of the IC. In addition, due to the manufacturing variability that defines the signature, one cannot manufacture two identical ICs even with full knowledge of the IC's design. Various types of variability of an IC can be used to define such a signature such as, for example, gate delay(s), power-on state(s) of a memory device (e.g., a static random-access memory (SRAM) device), and/or any of a variety of physical characteristics of an IC.

In recent years, unconventional nonvolatile memory (NVM) devices, such as ferroelectric random access memory (FRAM) devices, magnetic random access memory (MRAM) devices, phase-change random access memory (PRAM) devices, and resistive random access memory (RRAM) devices, have emerged. In particular, RRAM devices, which exhibit a switching behavior between a high resistance state and a low resistance state, have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, etc.

Generally, an RRAM device, or more particularly an RRAM cell, includes a top electrode (e.g., an anode) and a bottom electrode (e.g., a cathode) with a variable resistance dielectric layer interposed therebetween. In some examples, an RRAM cell may further include a capping layer interposed between the top electrode and the variable resistance dielectric layer thereby causing the RRAM cell to have a bipolar switching behavior. The term "bipolar" as used herein refers to the two voltage polarities of an RRAM cell that exhibits a first conductive behavior with a first polarity of voltage applied across the top and bottom electrodes, and a second conductive behavior with a second polarity (a polarity opposite to the first polarity) of voltage applied across the top and bottom electrodes. In some embodiments, during a write operation to the RRAM cell, a 'set' voltage is applied across the top and bottom electrodes to change the variable resistance dielectric layer from a first resistivity (e.g., a high resistance state (HRS)) to a second resistivity (e.g., a low resistance state (LRS)). Similarly, a 'reset' voltage (e.g., opposite to the set voltage in polarity) may be applied across the top and bottom electrodes to change the variable resistance dielectric layer from the second resistivity back to the first resistivity, for example, from LRS to HRS. Therefore, the LRS and HRS may correspond to a logical "1" and a logical "0" (or vice versa), respectively.

The present disclosure provides various embodiments of systems and methods to generate a PUF signature, by an authentication circuit, for an RRAM cell array via utilizing randomly distributed characteristics of plural RRAM cells across the RRAM cell array. More specifically, the RRAM array includes a plurality of RRAM memory bits (hereinafter "bits"), and each bit includes two RRAM cells. By leveraging the above-mentioned manufacturing variability while forming the RRAM cells, in some embodiments, even though two RRAM cells in a single bit are applied with an identical bias condition (e.g., an identical voltage and/or an identical current), these two RRAM cells may still present respective different characteristics such as, for example, respective set voltages, respective reset voltages, etc. The respective different characteristics of the two RRAM cells in a single bit allows the authentication circuit to designate the two RRAM cells as a logical 1 and a logical 0, respectively. Further, corresponding locations (e.g., address of each bit) of the designated logical 1 and logical 0 are randomly distributed (i.e., unpredictable), again because of the manufacturing variability. As such, the authentication circuit may choose either a logical 1 or a logical 0 from each bit to generate a PUF signature. Consequently, such a PUF signature generated by the disclosed authentication circuit may advantageously be more "unpredictable," and thus more "reliable."

Figure 1:
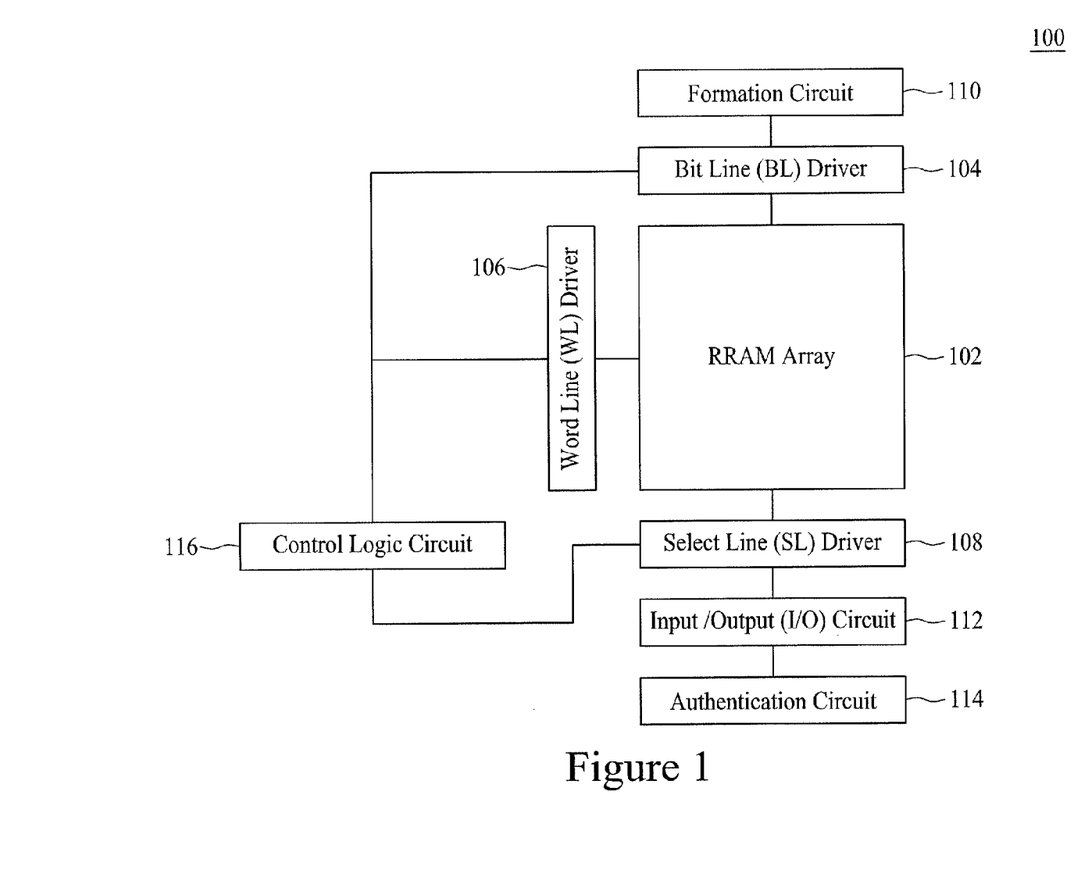
FIG. 1 illustrates an exemplary block diagram of a memory device that includes a resistive random access memory (RRAM) array, in accordance with some embodiments.

FIG. 1 illustrates an exemplary block diagram of a memory device 100, in accordance with various embodiments. As shown, the memory device 100 includes an RRAM cell array 102 (hereinafter "array"), a bit line (BL) driver 104, a word line (WL) driver 106, a select line (SL) driver 108, a formation circuit 110, an input/output (I/O) circuit 112, an authentication circuit 114, and a control logic circuit 116.

In some embodiments, the array 102 includes a plurality of bits, and, more specifically, each bit includes two RRAM cells, wherein each bit's respective RRAM cells are substantially similar to each other. In general, as discussed in further detail below with respect to FIGS. 2A and 2B, in addition to the top electrode, the optional capping layer, the variable resistance dielectric layer, and the bottom electrode that form a resistor (with variable resistance), each RRAM cell further includes a transistor coupled, in series, to the resistor. As such, in some embodiments of the present disclosure, each RRAM cell may include three nodes/terminals that are each coupled to a bit line (BL), a word line (WL), and a selector line (SL), respectively. Accordingly, in some embodiments, each bit, comprising two RRAM cells, may include six terminals that are coupled to a first set of BL, WL, and SL, and a second set of BL, WL, and SL, respectively.

As discussed in further detail below with respect to FIGS. 4A, 4B, and 4C, in some embodiments, the plurality of bits in the array 102 are arranged in a three-dimensional column-row configuration, wherein the array 102 includes a plurality of BL's that are arranged along a first horizontal direction (i.e., the column), and pluralities of WL's and SL's that are arranged along a second horizontal direction (i.e., the row) that is perpendicular to the first horizontal direction. Further, each BL intersects with plural pairs of WL's and SL's, and at each intersection, a bit comprising two RRAM cells is disposed vertically between one or more respective BL's and one or more respective SL's (and/or WL's). Various embodiments of the physical configuration of the array 102 will be discussed in further detail below with respect to FIGS. 4A, 4B, and 4C.

Through the BL's, WL's, and SL's, the bits of the array 102 are each coupled to the BL driver 104, the WL driver 106, the SL driver 108, respectively. In some embodiments, the BL driver 104 may include one or more multiplexers, switch devices, and/or the like that are each configured to select one or more of the BL's so as to assert respectively coupled bit(s). Similarly, the WL driver 106 and the SL driver 108 may each include one or more multiplexers, switch devices, and/or the like that are each configured to select one or more of the WL's and SL's so as to assert coupled bit(s), respectively. In some embodiments, through the respective BL or BL's, each bit may be further coupled to the formation circuit 110. The formation circuit 110 may include one or more voltage source circuits and/or current source circuits that are configured to "form" one of the two RRAM cells of the respective bit, which will be discussed in further detail below with respect to FIGS. 3A, 3B, and 3C.

In accordance with various embodiments, each of the bits of the array 102 may be further coupled to the I/O circuit 112 through respective BL or BL's. The I/O circuit 112 includes a plurality of sensing amplifiers (SA's) that are each configured to "read" a data bit (either a logical 1 or a logical 0) from one or more bits of the array 102. In some embodiments, such read data bit may be used by the authentication circuit 114 to generate one or more PUF signatures. Accordingly, the authentication circuit 114 may include a PUF generator, an error correction circuit, a compiler, etc.

In some embodiments, the control logic circuit 116 may be coupled to the BL driver 104, the WL driver 106, and the SL driver 108, and is configured to control each of them. For example, the control logic circuit 116 may provide a column address to the BL driver 104 so as to cause the BL driver 104 to assert one or more corresponding bit(s) that are arranged in the column address; the control logic circuit 116 may provide a row address to the WL driver 106 so as to cause the WL driver 106 to provide a WL assertions signal to activate one or more selection transistors that are arranged in the row address; the control logic circuit 116 may provide a selector address to the SL driver 108 so as to cause the SL driver 108 to assert one or more corresponding bit(s) that are arranged in the selector address.

Figure 2A:
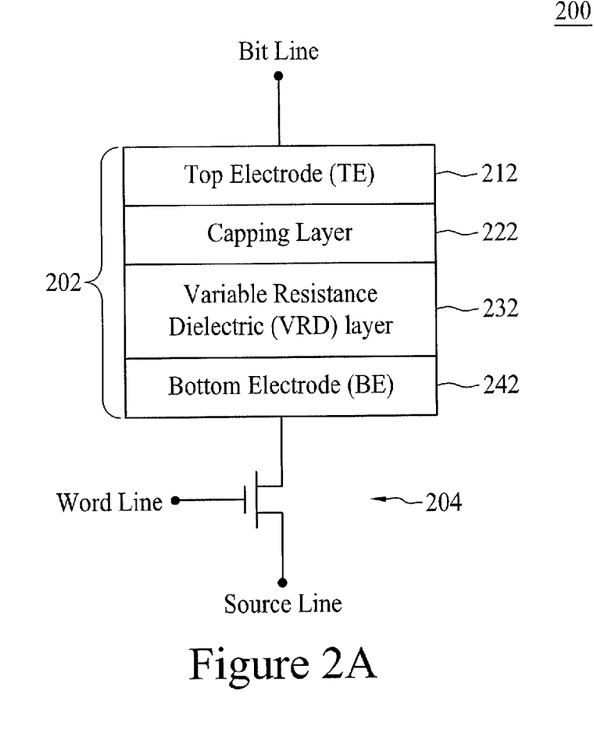
FIG. 2A illustrates an exemplary hybrid layout of an RRAM cell in the RRAM array of FIG. 1, in accordance with some embodiments.

FIG. 2A illustrates an exemplary structure of an RRAM cell 200 of a bit of the array 102 (FIG. 1), in accordance with some embodiments. In the illustrated embodiment of FIG. 2A, the RRAM cell 200 is implemented as a 1-transistor-1-resistor (1T1R) structure. More specifically, a resistor 202 with variable resistance is serially connected to a transistor 204. However, any of a variety of structures that exhibits the characteristic of variable resistance may be included in the RRAM cell such as, for example, an 1-diode-1-resistor (1D1R) structure, a 1-transistor-many resistors (1T-manyR) structure, a cross-bar structure, an eFuse device, an anti-eFuse device, etc., while remaining within the scope of the present disclosure.

Referring still to FIG. 2A, the RRAM cell 200 includes a resistor 202 and a transistor 204 coupled to the resistor 202, in series. In some embodiments, the resistor 202 is formed as a multi-layer stack that includes a top electrode (TE) 212, a capping layer 222, a variable resistance dielectric (VRD) layer 232, and a bottom electrode (BE) 242. In some embodiments, the TE 212 may be formed from at least one of the materials selected from: Pt, TiN/Ti, TiN, Ru, Ni, and combinations thereof; the capping layer 222 may be formed from at least one of the transition metal materials such as, Ti, Ni, Hf, Nb, Co, Fe, Cu, V, Ta, W, Cr, and combinations thereof; the VRD layer 232 may be formed from at least one of the transition metal oxide materials such as, $TiO_x$, $NiO_x$, $HfO_x$, $NbO_x$, $CoO_x$, $FeO_x$, $CuO_x$, $VO_x$, $TaO_x$, $WO_x$, $CrO_x$, and combinations thereof; and the BE 242 may be formed of at least one of the materials selected from: TiN, TaN, W, Pt, and combinations thereof. In some embodiments, the VRD layer 232 may include a high-k dielectric layer. In general, the VRD layer 232 may be formed by deposition, for example, atomic layer deposition (ALD), chemical vapor deposition (CVD), meta-organic chemical vapor deposition (MOCVD), etc., to have a particular thickness and crystalline structure using a particular manufacturing process recipe. Although an identical process recipe may be used to form two or more VRD layers 232 for respective RRAM cells, due to the manufacturing variability, these RRAM cells may not present identical characteristics when compared to one another.

As described above, each RRAM cell further includes a transistor coupled to the respective resistor, in series. In some embodiments, such a transistor is typically referred to as a "selection transistor," or an "enablement transistor" that is configured to enable a conduction path to flow through the coupled resistor. As shown in FIG. 2, the selection transistor 204 is coupled to the resistor 202, in series. Further, in some embodiments, the TE 212 is coupled to a BL and is configured to receive the above-mentioned set/reset voltage; a drain of the selection transistor 204 is coupled to the BE 242, a gate of the selection transistor 204 is coupled to a WL and is configured to receive one or more WL assertion signals so as to enable the corresponding RRAM cell 200 to be accessed, and a source of the transistor 204 is coupled to a SL and is configured to receive the above-mentioned set/reset voltage.

Figure 2B:
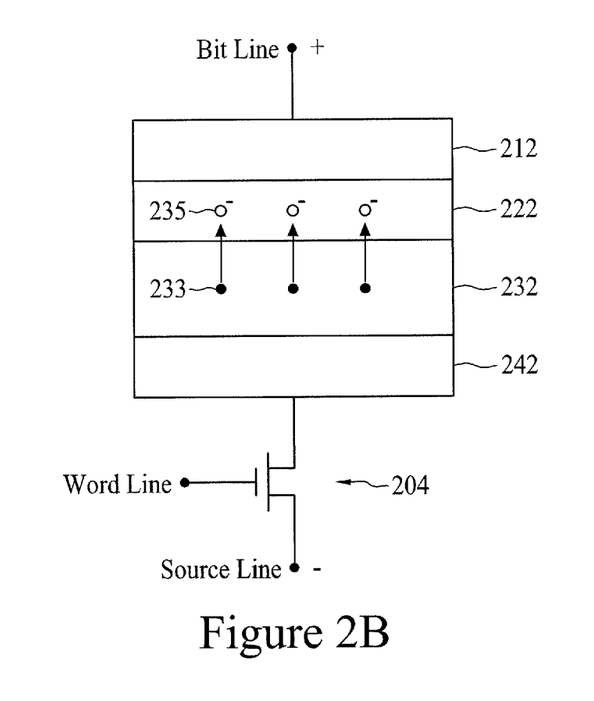
FIG. 2B illustrates an exemplary operation of the RRAM cell of FIG. 2A, in accordance with some embodiments.

Referring now to FIG. 2B, to operate the RRAM cell 200, the transistor 204 is activated (i.e., turned on) by an assertion signal through the WL, and then a voltage with a polarity (e.g., BL is provided with a positive voltage and SL is ground) is applied across the RRAM cell 200. As such, the higher voltage at BL (and TE 212) pulls negatively charged oxygen ions 235 from the VRD layer 232 to the capping layer 222 and thus leaves oxygen vacancies 233 within the VRD layer 232, which allows electron(s) that are present in the BE 242 to travel (hop) from the BE 242 through the VRD and capping layers 232 and 222, respectively, and ultimately to the TE 212. Consequently, a conduction path through the VRD layer 232 is "formed." Before such a conduction path is formed, the resistor 202 remains at the HRS. In some embodiments, upon formation of the conduction path, the resistor 202 transitions from the HRS to the LRS, and a relatively higher magnitude of current flows between the BL and the SL.

Figure 3A:
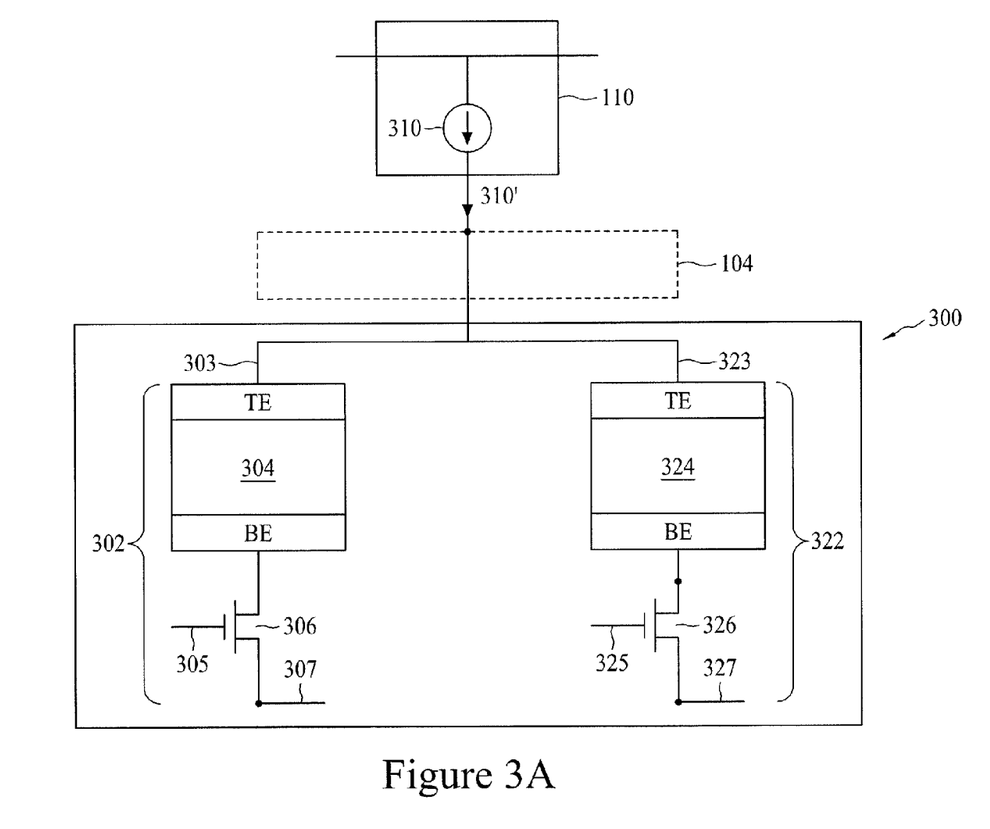
FIG. 3A illustrates an exemplary hybrid layout of a bit in the RRAM array and a part of a formation circuit of FIG. 1, in accordance with some embodiments.

Referring now to FIG. 3A, an exemplary diagram of a bit 300 of the array 102 is illustrated, in accordance with various embodiments. As mentioned above, in some embodiments, each bit of the array 102 includes two RRAM cells. More specifically, in the illustrated embodiment of FIG. 3A, the bit 300 includes two RRAM cells 302 and 322 that are disposed in parallel with each other. The RRAM cells 302 and 322 are each substantially similar to the RRAM cell 200 of FIG. 2A. As such, the RRAM cell 302 includes: a variable resistance resistor 304, and a serially coupled transistor 306; the RRAM cell 322 includes: a variable resistance resistor 324, and a serially coupled transistor 326. The RRAM cell 302 is coupled to each of BL 303, WL 305 and SL 307 via a TE of the resistor 304, a gate of the transistor 306 and a source of the transistor 306, respectively; the RRAM cell 322 is coupled to each of BL 323, WL 325 and SL 327 via a TE of the resistor 324, a gate of the transistor 326 and a source of the transistor 326, respectively.

In some embodiments, the BL's 303 and 323 are coupled to the formation circuit 110 through the BL driver 104. As shown, the formation circuit 110 includes a current source circuit 310. Such a current source circuit 310 is configured to provide a constant current 310' to the RRAM cells 302 and 322 through respective BL's 303 and 323. In some embodiments, the constant current 310' may serve as a "winner-takes-all" current for the RRAM cells 302 and 322 to compete with each other so as to allow the bit 300 to be written as a logical 1 and a logical 0, which will be discussed in further detail below.

In some embodiments, before the constant current 310' is applied to the RRAM cells 302 and 322, the selections transistors 306 and 326 may be turned on by assertion signals through respective WL's 305 and 325. In some embodiments, the assertion signals may be provided by the WL driver 106. Moreover, the SL's 307 and 327 may be each pulled to ground by the SL driver 108. When the constant current 310' (e.g., about 50~100 µA) is applied to both of the RRAM cells 302 and 322, due to the above-mentioned manufacturing variability, one of the RRAM cells, for example, the RRAM cell 302, may be "formed" first, as described in FIG. 2B. Based on the above-described operation of the RRAM cells, once an RRAM cell is formed, the RRAM cell may transition from the HRS to the LRS, and when the RRAM cell is not yet formed, the RRAM cell may remain at the HRS. As such, in some embodiments, most of the applied constant current 310' may flow through the RRAM cell at the LRS based on the principle of the Ohm's Law. Continuing with the above example, consequently, the RRAM cell 302 (now at the LRS) wins over the RRAM cell 304 (still at the HRS) and thus takes most of the current 310'. Accordingly, in some embodiments, such an initial "forming" process may be self-terminated upon one of the RRAM cells in each bit transitioning to the LRS.

In some alternative embodiments, the formation circuit 110 may include voltage source circuit (not shown) coupled with a current limiter (not shown). The current limiter may be coupled between the voltage source circuit and respectively coupled RRAM cells, e.g., 302 and 322. In such embodiments, the voltage source circuit may be configured to provide a formation voltage to the RRAM cells 302 and 322 so as to perform an initial forming process while the current limiter may be configured to concurrently monitor a level of current flowing through either the RRAM cell 302 or RRAM cell 322 based on a pre-determined threshold (e.g., a maximum current level). As such, when either of the RRAM cells 302 and 322 is formed first, e.g., the RRAM cell 302, the RRAM cell 302 transitions from the HRS to the LRS. Accordingly, the formation voltage is won by the formed RRAM cell 302 and a current with a relatively large level flows from the voltage source circuit, and through the current limiter and the RRAM cell 302. In some embodiments, in response to the current limiter detecting such a current with the relatively large level exceeds the predetermined threshold, the current limiter may terminate the initial forming process.

Because of the unpredictable nature regarding which of the RRAM cells in a bit will be fainted first, in some embodiments, the formation circuit 110 may use an included voltage source (e.g., 350 of FIG. 3B) to provide a first voltage (e.g., about 1~2 V) to both of the SRAM cells 302 and 322 so as to cause the I/O circuit 112 to discriminate which RRAM cell is at the LRS and which RRAM cell is at the HRS. More specifically, continuing with the above example, due to the difference of the states (i.e., LRS and HRS) that the RRAM cells 302 and 322 presents, respectively, the I/O circuit 112 may detect a higher current flowing through the RRAM cell 302 (LRS) and a lower current through the RRAM cell 322 (HRS). In alternative embodiments, instead of detecting differences in current magnitudes, the I/O circuit 112 may monitor voltages present on the respective BL's (303 and 323) or SL's (307 and 327). That is, because of the different states (different resistance), at a particular time, the voltage present on the BL 303 or SL 307 may be higher than the voltage present on the BL 323 or SL 327. Yet in some other embodiments, the I/O circuit 112 may compare the voltages present on the BL's (303 and 323) or SL's (307 and 327) with a reference voltage so as to discriminate the respective states of the RRAM cells. Accordingly, the I/O circuit 112 may inform the formation circuit 110 and the authentication circuit 114 of the state that each RRAM cell presents.

Figure 3B:
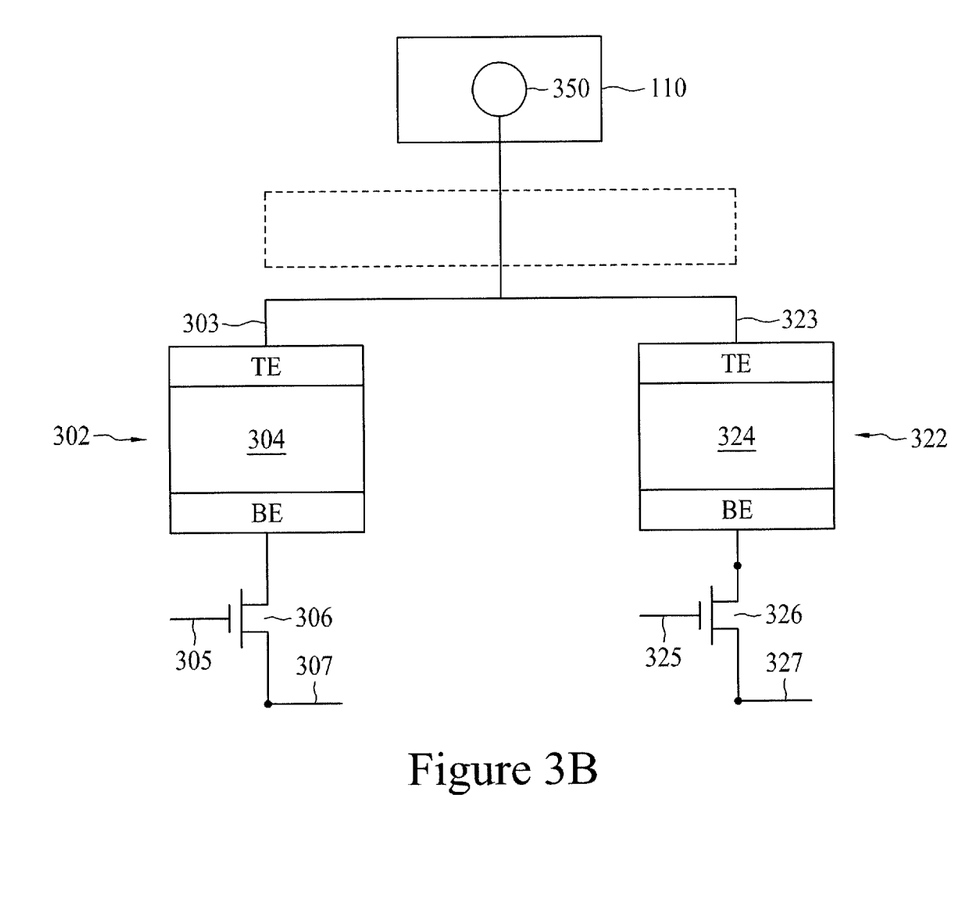
FIG. 3B illustrates an exemplary hybrid layout of the bit of the FIG. 3A and another part of the formation circuit of FIG. 1, in accordance with some embodiments.

Subsequently, in some embodiments, the formation circuit 110 may further apply a second voltage (e.g., about 3V) to the RRAM cell at the LRS. The second voltage is substantially higher than the first voltage so as to provide an additional forming process to the RRAM cell at the LRS (e.g., 302 in the above example). In some embodiments, the provision of such an additional forming process may advantageously provide better data retention. And accordingly, the authentication circuit 114 may designate the RRAM cells 302 and 322 with respective logical states. In some embodiments, the authentication circuit 114 may designate the RRAM cell 302 with a logical 1, and the RRAM cell 304 with a logical 0. In some other embodiments, the authentication circuit 114 may designate the RRAM cell 302 with a logical 0, and the RRAM cell 304 with a logical 1. The following discussion will use the former designation, i.e., the LRS corresponds to a logical 1 and the HRS corresponds to a logical 0. As such, the RRAM cells 302 and 324 of the bit 300 then are each written to a respective bit data (a logical 1 and a logical 0, respectively).

Additionally or alternatively, in some embodiments, the authentication circuit 114 may designate the logical states to the RRAM cells of each bit before the second voltage is applied to the RRAM cell in the LRS. As such, the authentication circuit 114 may perform the designation after the authentication circuit 114 is informed of the state that each RRAM cell presents (i.e., right after the first voltage is applied).

Figure 3C:
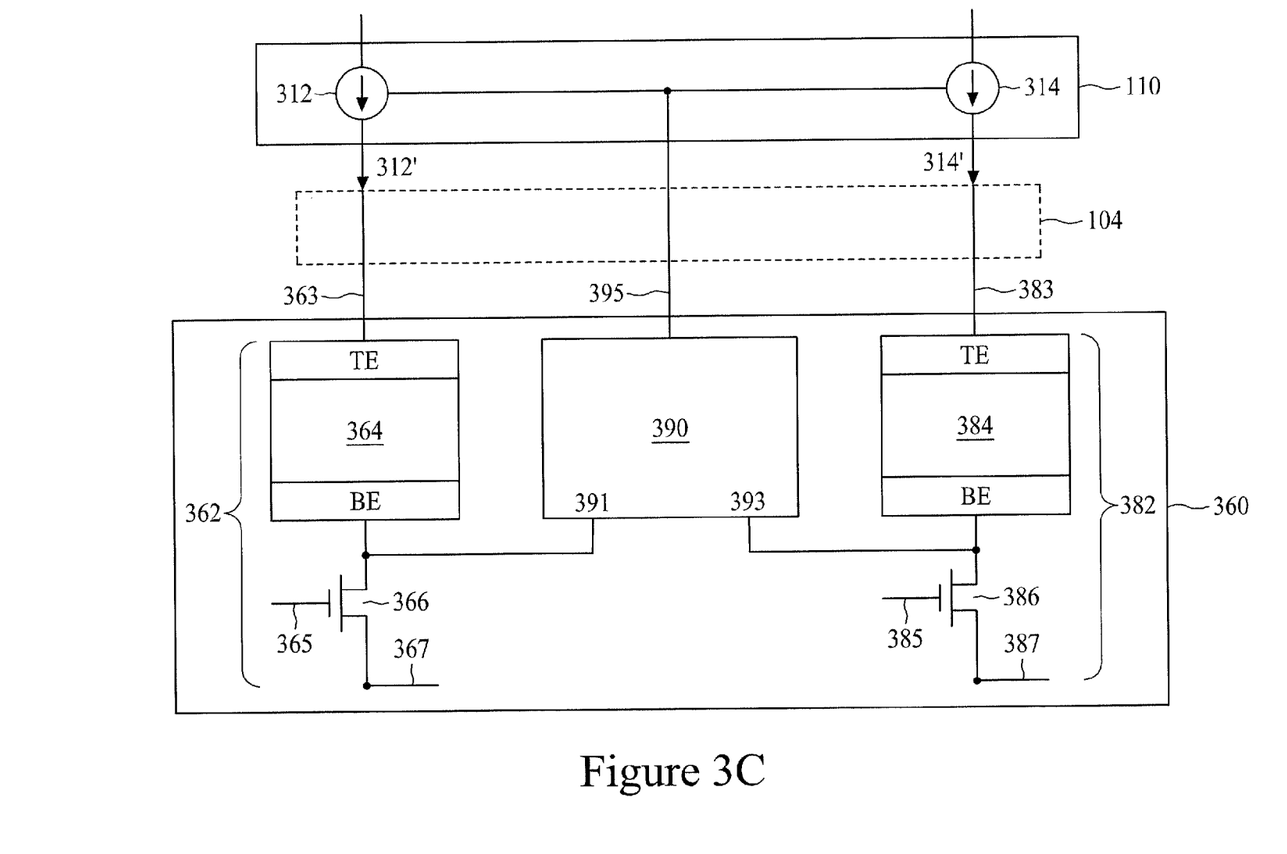
FIG. 3C illustrates an exemplary layout of another bit in the RRAM array and yet another part of the formation circuit of FIG. 1, in accordance with some embodiments.

Referring now to FIG. 3C, another exemplary diagram of a bit 360 of the array 102 is illustrated, in accordance with various embodiments. The bit 360 is substantially similar to the bit 300 except that the bit 360 further includes a forming detection circuit 390 and RRAM cells of the bit 360 are each coupled to a respective current source circuit, which will be described below. For example, in the illustrated embodiment of FIG. 3C, the bit 360 includes two RRAM cells 362 and 382 that are disposed in parallel with each other. The RRAM cell 362 includes: a variable resistance resistor 364, and a serially coupled transistor 366. Similarly, the RRAM cell 382 includes: a variable resistance resistor 384, and a serially coupled transistor 386. The RRAM cell 362 is also coupled to each of BL 363, WL 365 and SL 367 via a TE of the resistor 364, a gate of the transistor 366 and a source of the transistor 366, respectively. Similarly, the RRAM cell 382 is coupled to each of BL 383, WL 385 and SL 387 via a TE of the resistor 384, a gate of the transistor 386 and a source of the transistor 386, respectively.

Different from the bit 300 of FIG. 3A, in some embodiments, each RRAM cell of the bit 360 is coupled to a respective current source circuit of the formation circuit 110. As shown, the RRAM cell 362 is coupled to the current source circuit 312 via the BL 363, and the RRAM cell 382 is coupled to the current source circuit 314 via the BL 383. In some embodiments, the forming detection circuit 390 includes two inputs 391 and 393 that are coupled to the RRAM cells 362 and 382, respectively. More specifically, the input 391 is coupled between a BE of the resistor 364 and a drain of the transistor 366, and the input 393 is coupled between a BE of the resistor 384 and a drain of the transistor 386. The forming detection circuit 390 includes an output 395 that is coupled to the current source circuits 312 and 314 of the formation circuit 110. In some embodiments, each of the current source circuits 312 and 314 is substantially similar to the current source circuit 310. That is, the current source circuit 312 is configured to provide a constant current 312' to the RRAM cell 362, and the current source circuit 314 is configured to provide a constant current 314' to the RRAM cell 382.

In some embodiments, the operation of the bit 360 is substantially similar to the above-described operation of the bit 300 except that the initial forming process in the bit 360 is determined by the forming detection circuit 390. Similarly, before the constant currents 312' and 314' are each applied to the RRAM cells 362 and 382, the selections transistors 366 and 386 may be turned on by respective assertion signals through WL's 365 and 385. In some embodiments, the assertion signals may be provided by the WL driver 106. Moreover, the SL's 367 and 387 may be each pulled to ground by the SL driver 108. In some embodiments, the constant current 312' and 314' are approximately at a same current level, e.g., about 50~100 μA. When the constant currents 312' and 314' are each applied to the RRAM cells 362 and 382, due to the above-mentioned manufacturing variances, one of the RRAM cells, for example, the RRAM cell 362, may be "formed" first. Based on the above-described operation of the RRAM cells, once an RRAM cell is formed, the RRAM cell may transition from the HRS to the LRS, and when the RRAM cell is not yet formed, the RRAM cell may remain at the HRS.

In some embodiments, the forming detection circuit 390 is configured to monitor resistances of the resistors 364 and 384. Once the forming detection circuit 390 detects a substantial difference of the resistances between the resistors 364 and 384, the forming detection circuit 390 may cause the current source circuits 312 and 314 to cease providing currents 312' and 314'. As such, the initial forming process of one of the RRAM cells (i.e., the cell that transitions to the LRS state) is terminated based on detection of a substantial difference of the resistances. Following similar operations as described above (i.e., a first voltage is each applied to the RRAM cells 362 and 382 so as to allow the I/O circuit 112 to discriminate which RRAM cell is at the LRS and which RRAM cell is at the HRS, and a second voltage is applied to the RRAM cell at the LRS for better data retention), the RRAM cells 362 and 382 may be each designated with a respective logical state. Continuing with the above example, the RRAM cells 362 (now at the LRS) is written to a logical 1, and the RRAM cell 382 (still at the HRS) is written to a logical 0.

Similarly, in some alternative embodiments, the formation circuit 110 may include two voltage source circuits (not shown) coupled to the RRAM cells 362 and 382, respectively, and further include two current limiters coupled between the respective voltage source circuit and RRAM cell. Functionalities of such voltage source circuits and current limiters are substantially similar to the voltage source circuit and current limiter coupled to the bit 300 so that discussions of operations of the voltage source circuits and current limiters coupled to the bit 360 are omitted.

In some embodiments, each of the plurality of the bits across the array 102 may follow the above-described operations to be written to a logical 1 and a logical 0. To recap, due to the unpredictable nature of the initial forming process, one cannot predict which of the RRAM cells in each bit will be formed first, that is, which RRAM cell will be written to a logical 1. As such, the logical 1's and the logical 0's are randomly distributed across the array 102. In accordance with some embodiments of the present disclosure, the authentication circuit 114 (FIG. 1) may pick either the written logical 1's or the logical 0's to generate an unique and unpredictable PUF signature, which advantageously makes the PUF signature more reliable.

As mentioned above, the plurality of bits across the array 102 is arranged in a three-dimensional column-row configuration. FIGS. 4A, 4B, and 4C are exemplary circuit diagrams each illustrating part of the array 102, in accordance with various embodiments of the present disclosure. It is noted that the circuit diagrams of FIGS. 4A-4C are merely examples for purposes of illustration. Thus, any of a variety of other configurations may be used to implement the array 102 while remaining within the scope of the present disclosure.

Figure 4A:
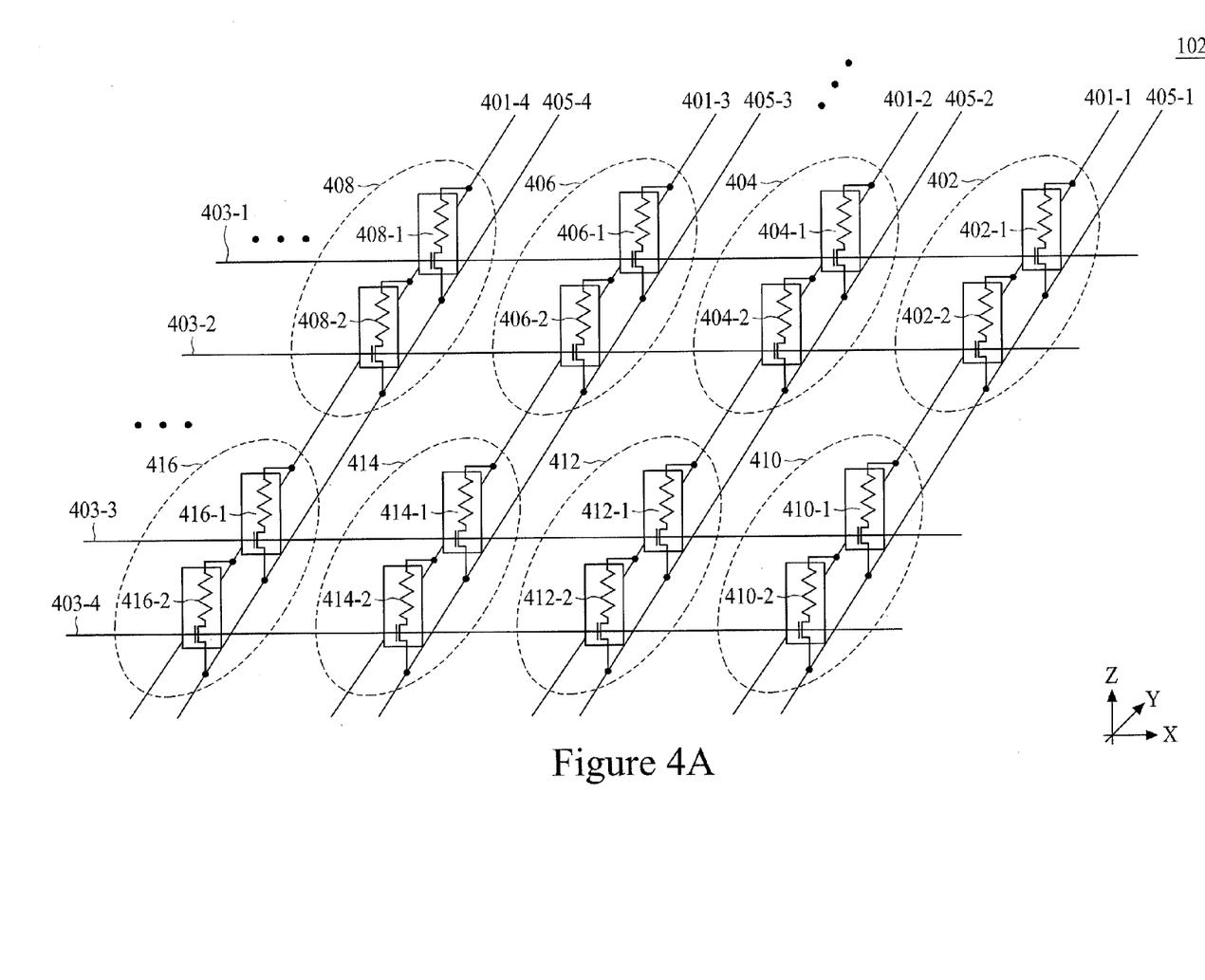
FIG. 4A illustrates an exemplary circuit diagram of the RRAM array of FIG. 1, in accordance with some embodiments.

Referring now to FIG. 4A, the array 102 includes eight bits: 402, 404, 406, 408, 410, 412, 414, and 416, wherein each bit includes two RRAM cells. Although only eight bits are shown in FIG. 4A, any desired number of bits may be included in the array 102 while remaining within the scope of the present disclosure. The bit 402 includes RRAM cells 402-1 and 402-2; the bit 404 includes RRAM cells 404-1 and 404-2; the bit 404 includes RRAM cells 406-1 and 406-2; the bit 408 includes RRAM cells 408-1 and 408-2; the bit 410 includes RRAM cells 410-1 and 410-2; the bit 412 includes RRAM cells 412-1 and 412-2; the bit 414 includes RRAM cells 414-1 and 414-2; the bit 416 includes RRAM cells 416-1 and 416-2. More specifically, each RRAM cell includes a resistor and a transistor that are coupled in series, as shown in the exemplary RRAM cell 200 of FIG. 2A. For clarity, numerals for each RRAM cell's respective resistor and transistor are not shown in FIG. 4A (and FIGS. 4B and 4C).

As shown, the array 102 further includes BL's: 401-1, 401-2, 401-3, and 401-4, WL's: 403-1, 403-2, 403-3, and 403-4, and SL's: 405-1, 405-2, 405-3, and 405-4. In some embodiments, the BL's 401-1, 401-2, 401-3, and 401-4 are arranged horizontally along the Y direction (e.g., columns), the WL's 403-1, 403-2, 403-3, and 403-4, and SL's 405-1, 405-2, 405-3, and 405-4 are respectively arranged horizontally along the X direction (e.g., rows). Moreover, each BL intersects with plural pairs of WL's and SL's, and at each intersection, one RRAM cell is vertically (i.e., along the Z direction) disposed between the common BL and respective SL with the respective WL being disposed between the SL and the common BL. For example, the RRAM cells 402-1, 402-2, 410-1, and 410-2 are disposed between the intersection of the BL 401-1 and the pairs of WL and SL (403-1 and 405-1), (403-2 and 405-2), (403-3 and 405-3), and (403-4 and 405-4), respectively. Further, the WL 403-1 is disposed between the BL 401-1 and 405-1; the WL 403-2 is disposed between the BL 401-1 and 405-2; the WL 403-3 is disposed between the BL 401-1 and 405-3; the WL 403-4 is disposed between the BL 401-1 and 405-4.

Figure 4B:
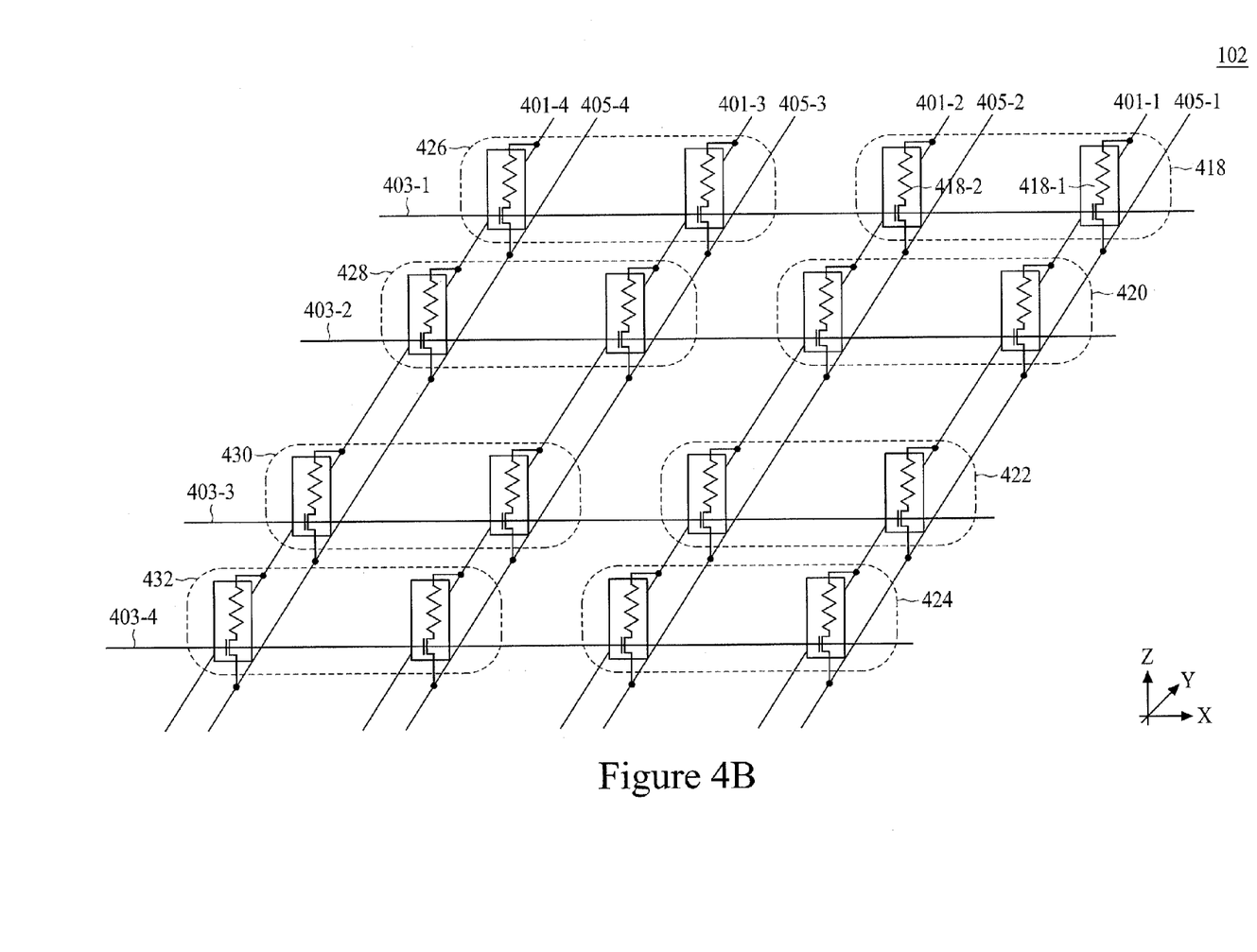
FIG. 4B illustrates another exemplary circuit diagram of the RRAM array of FIG. 1, in accordance with some embodiments.
Figure 4C:
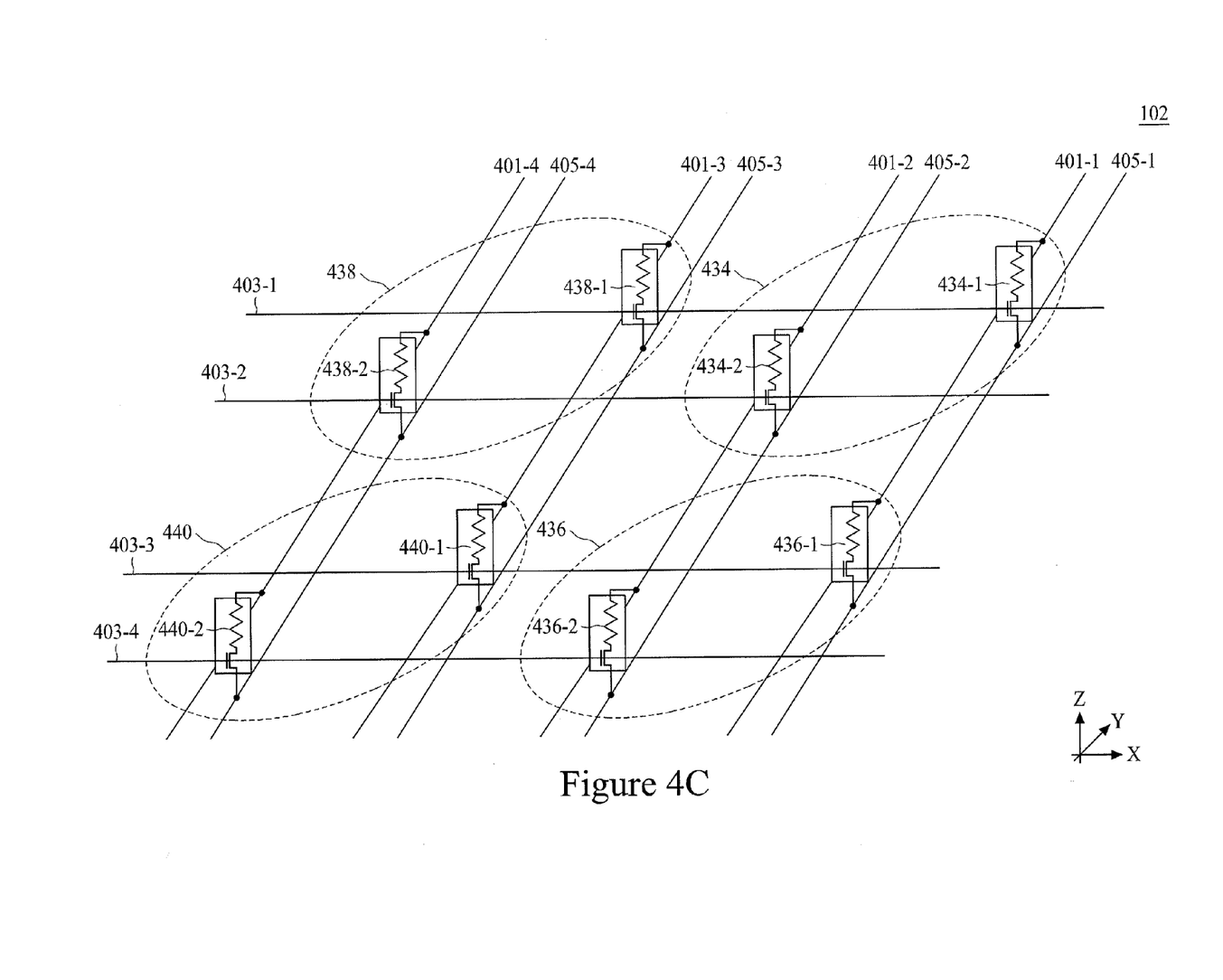
FIG. 4C illustrates yet another exemplary circuit diagram of the RRAM array of FIG. 1, in accordance with some embodiments.

However, it is understood that the illustrated embodiments of FIGS. 4A-4C are merely examples for illustration purpose. The BL's (401-1, 401-2, 401-3, 401-4, etc.), WL's (403-1, 403-2, 403-3, 403-4, etc.), and SL's (405-1, 405-2, 405-3, 405-4, etc.) may be laid out in any of a variety of configurations. For example, in some embodiments, the BL's (401-1, 401-2, 401-3, 401-4, etc.) are arranged along the X direction, the SL's (405-1, 405-2, 405-3, 405-4, etc.) are arranged in parallel with the BL's, i.e., also along the X direction, and the WL's (403-1, 403-2, 403-3, 403-4, etc.) are arranged perpendicularly to the SL's and BL's, i.e., along the Y direction.

In some embodiments, when the bits of the array 102 arranged as the embodiment of FIG. 4A, each bit may be written to a logical 1 and a logical 0 by applying a constant current through the respective BL, as described above. For example, a constant current is applied to the bits 402 and 410 through the BL 401-1, and then, for example, the RRAM cell 402-1 of the bit 402 and the RRAM cell 410-2 of the bit 410 are formed (i.e., at the LRS), respectively. Subsequently, following the operation described with respect to FIG. 3B, the state of each RRAM cell is determined by the I/O circuit 112. In this example of FIG. 4A, in some embodiments, the I/O circuit 112 may determine the state of each RRAM cell by monitoring a voltage present on a respectively coupled SL (e.g., 405-1, 405-2, 405-3, 405-4, etc.). Accordingly, the logical 1's are designated to the RRAM cells 402-1 and 410-2, respectively, and the logical 0's are designated to the RRAM cells 402-2 and 410-1, respectively. Consequently, the authentication circuit 114 then uses either the logical 1's present on the RRAM cells 402-1 and 410-2 or the logical 0's present on the RRAM cells 402-2 and 410-1 for generating a PUF signature, or part of the PUF signature.

FIG. 4B illustrates a substantially similar circuit diagram to FIG. 4A except that bits 418, 420, 422, 424, 426, 428, 430, and 432 each includes two RRAM cells that are each coupled to a respective and different BL. Thus, for purpose of clarity, the numerals of the BL's WL's and SL's in FIG. 4A are continued to be used in FIG. 4B. More specifically, RRAM cells 418-1 and 418-2 of the bit 418 are each coupled to BL's 401-1 and 401-2, respectively, but are coupled to common WL's 403-1 and SL's 405-1; RRAM cells 420-1 and 420-2 of the bit 420 are each coupled to BL's 401-1 and 401-2, respectively, but are coupled to common WL's 403-2 and SL's 405-2; RRAM cells 422-1 and 422-2 of the bit 422 are each coupled to BL's 401-1 and 401-2, respectively, but are coupled to common WL's 403-3 and SL's 405-3; RRAM cells 424-1 and 424-2 of the bit 424 are each coupled to BL's 401-1 and 401-2, respectively, but are coupled to common WL's 403-4 and SL's 405-4; RRAM cells 426-1 and 426-2 of the bit 426 are each coupled to BL's 401-3 and 401-4, respectively, but are coupled to common WL's 403-1 and SL's 405-1; RRAM cells 428-1 and 428-2 of the bit 428 are each coupled to BL's 401-3 and 401-4, respectively, but are coupled to common WL's 403-2 and SL's 405-2; RRAM cells 430-1 and 430-2 of the bit 430 are each coupled to BL's 401-3 and 401-4, respectively, but are coupled to common WL's 403-3 and SL's 405-3; RRAM cells 432-1 and 432-2 of the bit 432 are each coupled to BL's 401-3 and 401-4, respectively, but are coupled to common WL's 403-4 and SL's 405-4.

FIG. 4C illustrates another substantially similar circuit diagram to FIG. 4A except that bits 434, 436, 438, and 440 each includes two RRAM cells that are each coupled to respective and different BL, WL, and SL. For example, the RRAM cells 434-1 and 434-2 of the bit 434 are each coupled to the BL 401-1, WL 403-1, and SL 405-1, and BL 401-2, WL 403-2, and SL 405-2, respectively; the RRAM cells 436-1 and 436-2 of the bit 436 are each coupled to the BL 401-1, WL 403-3, and SL 405-3, and BL 401-2, WL 403-4, and SL 405-4, respectively; the RRAM cells 438-1 and 438-2 of the bit 438 are each coupled to the BL 401-3, WL 403-1, and SL 405-1, and BL 401-4, WL 403-2, and SL 405-2, respectively; the RRAM cells 440-1 and 440-2 of the bit 440 are each coupled to the BL 401-3, WL 403-3, and SL 405-3, and BL 401-4, WL 403-4, and SL 405-4, respectively.

Figure 5:
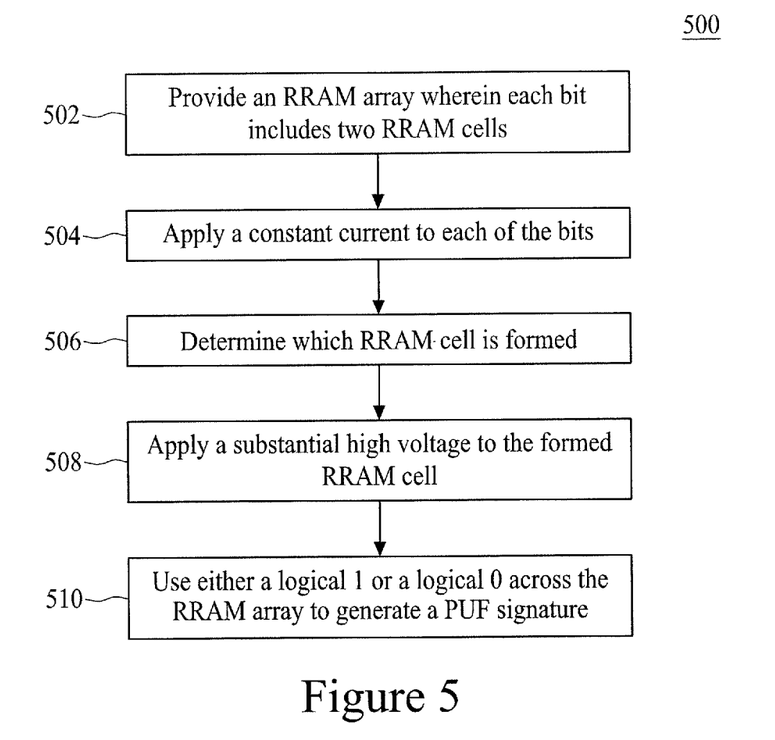
FIG. 5 illustrates a flow chart of a method to use the RRAM array of FIG. 1 to generate a PUF signature, in accordance with some embodiments.

FIG. 5 illustrates a flow chart of a method 500 to generate a PUF signature using an RRAM array that includes two RRAM cells per bit, in accordance with various embodiments. In various embodiments, the operations of the method 500 are performed by the respective components illustrated in FIGS. 1-4C. For purposes of discussion, the following embodiment of the method 500 will be described in conjunction with FIGS. 1-4C. The illustrated embodiment of the method 500 is merely an example. Therefore, it should be understood that any of a variety of operations may be omitted, re-sequenced, and/or added while remaining within the scope of the present disclosure The method 500 starts with operation 502 in which an RRAM array wherein each bit of the RRAM array includes two RRAM cells, in accordance with various embodiments. Such an RRAM array may be illustrated as one of the circuit diagrams with respect to FIGS. 4A-4C.

The method 500 continues to operation 504 in which each bit of the RRAM array is applied with one or more constant currents, in accordance with various embodiments. In the illustrated embodiment of FIG. 3A, for example, the RRAM cells of the bit 300 are provided with a common constant current. As such, the forming process may be self-terminated upon one of the RRAM cells being formed (as the LRS). In the illustrated embodiment of FIG. 3C, for example, the RRAM cells of the bit 360 are each applied with a respective different constant current. As such, the forming process may be terminated when the forming detection circuit 390 determines a substantial difference presents between the two RRAM cells.

The method 500 continues to operation 506 in which an I/O circuit coupled to the RRAM array determines which RRAM cell in each bit is formed, in accordance with various embodiments. In some embodiments, a first voltage (about 1~2V) may be applied, by a formation circuit (e.g., 110), to both of the RRAM cells in each bit, and then the I/O circuit (e.g., 112) discriminates the states (i.e., HRS and LRS) of the two RRAM cells by monitoring either the currents flowing through the RRAM cells or voltages present on the respectively coupled BL's or SL's. In some embodiments, during the operation 506, the determined states of the RRAM cells in each bit may be provided to the authentication circuit 114 for designation of respective logical states (e.g., a logical 1 or a logical 0).

The method 500 continues to operation 508 in which a second voltage, substantially higher than the first voltage (the operation 506), is applied to the formed RRAM cell of each bit, in accordance with various embodiments. That is, the second voltage is applied to the RRAM cell of each bit that has transitioned from the HRS to the LRS. In some embodiments, the second voltage is about 3 V. Such a substantially higher voltage applied to the formed RRAM cell may advantageously provide better data retention to the formed RRAM cell. In some embodiments, after the second voltage is applied to the formed RRAM cell of each bit, authentication circuit 114 may designate the formed RRAM cell a logical 1 and the unformed RRAM cell a logical 0 (or vice versa).

The method 500 continues to operation 510 in which the authentication circuit 114 uses either logical 1's or logical 0's across the RRAM array to generate a PUF signature, in accordance with various embodiments. As described above, since the logical 1's and 0's are randomly distributed across the RRAM array, the PUF signature generated based on such randomly distributed logical 1's or 0's may be more reliable.

In an embodiment, a memory device is disclosed. The memory device includes a memory array comprising a plurality of bits, wherein each bit comprises two memory cells each having a variable resistance; a formation circuit, coupled to the plurality of bits, and configured to cause a first memory cell of a first bit to be at a low resistance state; and an authentication circuit, coupled to the plurality of bits, configured to designate a logical state to the first memory cell of the first bit and use the logical state of the first memory cell of the first bit to generate a physically unclonable function (PUF) signature.

In another embodiment, a memory device includes a memory array comprising a plurality of bits, wherein each bit comprises two resistive random access memory (RRAM) cells that each having a variable resistance; a formation circuit, coupled to the plurality of bits, and configured to cause a first RRAM cell of a first bit to be at a low resistance state; and an authentication circuit, coupled to the plurality of bits, configured to designate a logical state to the first RRAM cell of the first bit and use the logical states of the first RRAM cells of the first bit to generate a physically unclonable function (PUF) signature.

Yet in another embodiment, a memory device includes a memory array comprising a plurality of bits, wherein each bit comprises two memory cells each having a variable resistance; a formation circuit, coupled to the plurality of bits, and configured to cause first and second memory cells of a first bit to transition to a low resistance state and remain at a high resistance state, respectively; and an authentication circuit, coupled to the plurality of bits, configured to designate first and second logical states to the first and second memory cells, respectively, of the first bit, and use either the first or the second logical states of the first bit to generate a physically unclonable function (PUF) signature.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory array comprising a plurality of bits, wherein each bit comprises two memory cells each having a variable resistance;
a formation circuit, coupled to the plurality of bits, and configured to cause a first memory cell and a second memory cell of a first bit to be at a low resistance state and at a high resistance state, respectively; and
an authentication circuit, coupled to the plurality of bits, configured to designate a logical state to the first memory cell of the first bit and use the logical state of the first memory cell of the first bit to generate a physically unclonable function (PUF) signature.

2. The memory device of claim 1, wherein each bit includes two resistive random access memory (RRAM) cells.

3. The memory device of claim 1, wherein the formation circuit is further configured to cause the second memory cell of the first bit to remain at the high resistance state.

4. The memory device of claim 1, further comprising:
an input/output (I/O) circuit, coupled to the plurality of bits, and configured to determine whether the first memory cell is at the low resistance state.

5. The memory device of claim 4, wherein the formation circuit further comprises:
a current source circuit that is coupled to the two memory cells of the first bit; and
a voltage source circuit that is coupled to the two memory cells of the first bit.

6. The memory device of claim 5, wherein the current source circuit is configured to provide a constant current to the two memory cells of the first bit and cause the constant current to flow through the first memory cell of the first bit so as to cause the first memory cell of the first bit to be at the low resistance state.

7. The memory device of claim 6, wherein the voltage source circuit is configured to provide a first voltage to the two memory cells of the first bit, and wherein the I/O circuit determines whether the first memory cell is at the low resistance state.

8. The memory device of claim 7, wherein the voltage source circuit is configured to provide a second voltage that is substantially higher than the first voltage to the first memory cell.

9. The memory device of claim 1, wherein the formation circuit further comprises:
first and second current source circuits that are each coupled to two memory cells of a second bit, respectively.

10. The memory device of claim 9, wherein the first and second current source circuits are configured to provide a first constant current and a second constant current to the two memory cells of the second bit, respectively, and wherein the first current source causes the first constant current to flow through the first memory cell of the second bit so as to cause the first memory cell of the second bit to be at the low resistance state.

11. A memory device, comprising:
a memory array comprising a plurality of bits, wherein each bit comprises two resistive random access memory (RRAM) cells that each having a variable resistance;
a formation circuit, coupled to the plurality of bits, and configured to cause a first RRAM cell of a first bit to be at a low resistance state and a second RRAM cell of the first bit to be at a high resistance state; and
an authentication circuit, coupled to the plurality of bits, configured to designate a logical state to the first RRAM cell of the first bit and use the logical states of the first RRAM cells of the first bit to generate a physically unclonable function (PUF) signature.

12. The memory device of claim 11, wherein the formation circuit is further configured to cause the second RRAM cell of the first bit to remain at the high resistance state.

13. The memory device of claim 11, further comprising:
an input/output (I/O) circuit, coupled to the plurality of bits, and configured to determine whether the first RRAM cell is at the low resistance state.

14. The memory device of claim 13, wherein the formation circuit further comprises:
a current source circuit that is coupled to the two RRAM cells of the first bit; and
a voltage source circuit that is coupled to the two RRAM cells of the first bit.

15. The memory device of claim 14, wherein the current source circuit is configured to provide a constant current to the two RRAM cells of the first bit and cause the constant current to flow through the first RRAM cell of the first bit so as to cause the first RRAM cell of the first bit to be at the low resistance state.

16. The memory device of claim 15, wherein the voltage source circuit is configured to provide a first voltage to the two RRAM cells of the first bit, and wherein the I/O circuit determines whether the first RRAM cell is at the low resistance state.

17. The memory device of claim 16, wherein the voltage source circuit is configured to provide a second voltage that is substantially higher than the first voltage to the first RRAM cell.

18. A memory device, comprising:
a memory array comprising a plurality of bits, wherein each bit comprises two memory cells each having a variable resistance;
a formation circuit, coupled to the plurality of bits, and configured to cause first and second memory cells of a first bit to transition to a low resistance state and remain at a high resistance state, respectively; and
an authentication circuit, coupled to the plurality of bits, configured to designate first and second logical states to the first and second memory cells, respectively, of the first bit, and use either the first or the second logical states of the first bit to generate a physically unclonable function (PUF) signature.

19. The memory device of claim 18, wherein each bit includes two resistive random access memory (RRAM) cells.

20. The memory device of claim 18, further comprising:
an input/output (I/O) circuit, coupled to the plurality of bits, and configured to determine whether the first memory cell is at the low resistance state.

* * * * *